(12) United States Patent
Park et al.

(10) Patent No.: US 8,846,429 B2
(45) Date of Patent: Sep. 30, 2014

(54) METHOD FOR MANUFACTURING SEMICONDUCTOR LIGHT EMITTING DEVICE ALLOWING FOR RECYCLING OF SEMICONDUCTOR GROWTH SUBSTRATE

(71) Applicant: Samsung Electronics Co., Ltd., Gyeonggi-do (KR)

(72) Inventors: Ki Ho Park, Gyeonggi-do (KR); Ki Sung Kim, Gyeonggi-do (KP); Chul Min Kim, Gyeonggi-do (KR); Suk Ho Yoon, Seoul (KR); Tae Hyun Lee, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/846,905

(22) Filed: Mar. 18, 2013

(65) Prior Publication Data
US 2013/0316481 A1    Nov. 28, 2013

(30) Foreign Application Priority Data
May 25, 2012 (KR) .................. 10-2012-0056280

(51) Int. Cl.
| | |
|---|---|
| *H01L 21/00* | (2006.01) |
| *H01L 21/30* | (2006.01) |
| *H01L 21/46* | (2006.01) |
| *H01L 33/00* | (2010.01) |

(52) U.S. Cl.
CPC .................. *H01L 33/0079* (2013.01)
USPC ............................. 438/46; 438/455

(58) Field of Classification Search
None
See application file for complete search history.

(56) References Cited

U.S. PATENT DOCUMENTS

| | | | |
|---|---|---|---|
| 6,547,647 B2 | 4/2003 | Chang | |
| 2001/0017257 A1* | 8/2001 | Choi et al. | 204/192.22 |
| 2006/0091409 A1* | 5/2006 | Epler et al. | 257/95 |
| 2010/0081221 A1* | 4/2010 | Lee et al. | 438/29 |
| 2014/0084422 A1* | 3/2014 | Dolukhanyan et al. | 257/618 |

FOREIGN PATENT DOCUMENTS

| | | |
|---|---|---|
| JP | 2000-138192 A | 5/2000 |
| JP | 2002-057129 A | 2/2002 |
| JP | 2010-283184 A | 12/2010 |
| KR | 100211648 B1 | 8/1999 |
| KR | 20080113479 A | 12/2008 |

* cited by examiner

*Primary Examiner* — Andres Munoz
(74) *Attorney, Agent, or Firm* — McDermott Will & Emery LLP

(57) ABSTRACT

A method for manufacturing a semiconductor light emitting device is provided. The method includes forming a light emitting structure by sequentially growing a first conductivity-type semiconductor layer, an active layer, and a second conductivity-type semiconductor layer on a semiconductor growth substrate A support unit is disposed on the second conductivity-type semiconductor layer, so as to be combined with the light emitting structure. The semiconductor growth substrate is separated from the light emitting structure. An interface between the semiconductor growth substrate and a remaining light emitting structure is wet-etched such that the light emitting structure remaining on the separated semiconductor growth substrate is separated therefrom. The semiconductor growth substrate is cleaned.

19 Claims, 5 Drawing Sheets

METHOD FOR MANUFACTURING SEMICONDUCTOR LIGHT EMITTING DEVICE ALLOWING FOR RECYCLING OF SEMICONDUCTOR GROWTH SUBSTRATE

CROSS-REFERENCE TO RELATED APPLICATION

This application claims the priority to Korean Patent Application No. 10-2012-0056280, filed on May 25, 2012, in the Korean Intellectual Property Office, the disclosure of which is incorporated herein by reference.

TECHNICAL FIELD

The present application relates to a method of manufacturing a semiconductor light emitting device.

BACKGROUND

A semiconductor light emitting device such as a light emitting diode (LED) is a device including a light emitting material, in which energy generated through electron-hole recombination in semiconductor junction parts is converted into light to be emitted therefrom. LEDs are commonly employed as light sources in illumination devices, display devices, and the like, and the development of LEDs has been accelerated.

In particular, the development and employment of gallium nitride (GaN)-based LEDs has recently increased, and mobile keypads, vehicle turn signal lamps, camera flashes, and the like, using such a gallium nitride-based LED, have been commercialized, and, in line with this, the development of general illumination devices using LEDs has accelerated. Like the products to which they are applied, such as a backlight unit of a large TV, a headlamp of a vehicle, a general illumination device, and the like, the purposes of LEDs are gradually moving from small portable products toward large-sized products having high output and high efficiency, and pertinent products require light sources that can support unit required characteristics thereof.

As the purposes of LEDs are broadened and LEDs are mass-produced, the recycling of semiconductor growth substrates used for manufacturing LEDs has emerged as an issue.

SUMMARY

An aspect of the present application provides a method for manufacturing a semiconductor light emitting device allowing for the recycling of a semiconductor growth substrate.

According to an aspect of the present application, there is provided a method for manufacturing a semiconductor light emitting device. The method includes forming a light emitting structure by sequentially growing a first conductivity-type semiconductor layer, an active layer, and a second conductivity-type semiconductor layer on a semiconductor growth substrate. A support unit is disposed on the second conductivity-type semiconductor layer, so as to be combined with the light emitting structure. The semiconductor growth substrate is separated from the light emitting structure. An interface is wet-etched between the semiconductor growth substrate and a remaining light emitting structure such that the light emitting structure remaining on the separated semiconductor growth substrate may be separated therefrom. The semiconductor growth substrate is cleaned.

The light emitting structure may be a nitride semiconductor layer, and the nitride semiconductor layer may be expressed by $Al_xIn_yGa_{(1-x-y)}N$, where $0 \leq x \leq 1$, $0 \leq y \leq 1$ and $0 \leq x+y \leq 1$.

The wet-etching step is performed by using an etching solution selected from the group consisting of KOH, NaOH, $NH_4OH$, and $H_2SO_3:HCl$, and a temperature for the wet-etching process may range from 20° C. to 300° C.

The step of separating the semiconductor growth substrate from the light emitting structure may be performed through a laser lift-off method.

The semiconductor growth substrate may be a substrate made of sapphire, SiC, Si, $MgAl_2O_4$, MgO, $LiAlO_2$, $LiGaO_2$, or GaN.

The method may further include: chemically or mechanically fine-polishing the semiconductor growth substrate, after the interface between the light emitting structure and the semiconductor growth substrate is wet-etched to separate the semiconductor layer remaining on the separated semiconductor growth substrate. A lapping process may not be performed in the operation of chemically or mechanically fine-polishing the semiconductor growth substrate.

The cleaning of the semiconductor growth substrate may include a chemical cleaning operation and a physical cleaning operation.

In another aspect, a method for manufacturing a semiconductor light emitting device is provided. The method includes forming a light emitting structure by sequentially growing a first conductivity-type semiconductor layer, an active layer, and a second conductivity-type semiconductor layer on a semiconductor growth substrate. A support unit is bonded on the second conductivity-type semiconductor layer, so as to be coupled with the light emitting structure. The semiconductor growth substrate is separated from the light emitting structure. A residual amount of the light emitting structure present on a surface of the semiconductor growth substrate is removed by way of chemical etching. The semiconductor growth substrate is cleaned such that it can be reused.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other aspects, features and other advantages of the present application will be more clearly understood from the following detailed description taken in conjunction with the accompanying drawings, in which.

DETAILED DESCRIPTION

Figure 1:
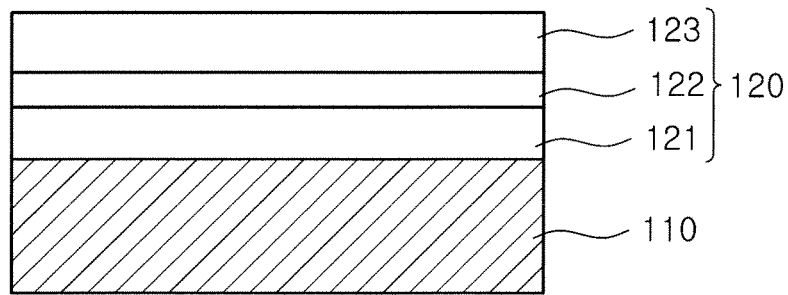
FIGS. 1 through 3 are cross-sectional views illustrating a sequential process of a method for manufacturing a semiconductor light emitting device according to an example of the present application.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

In the drawings, the shapes and dimensions of elements may be exaggerated for clarity, and the same reference numerals will be used throughout to designate the same or like components.

Figure 2:
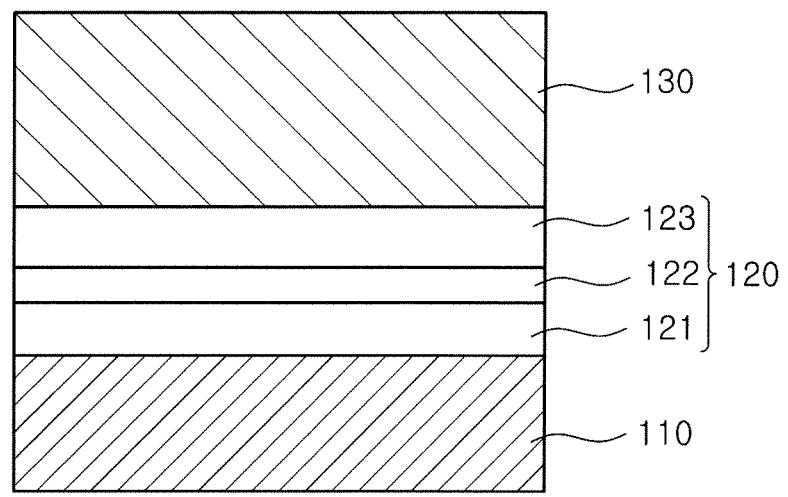
Figure 3:
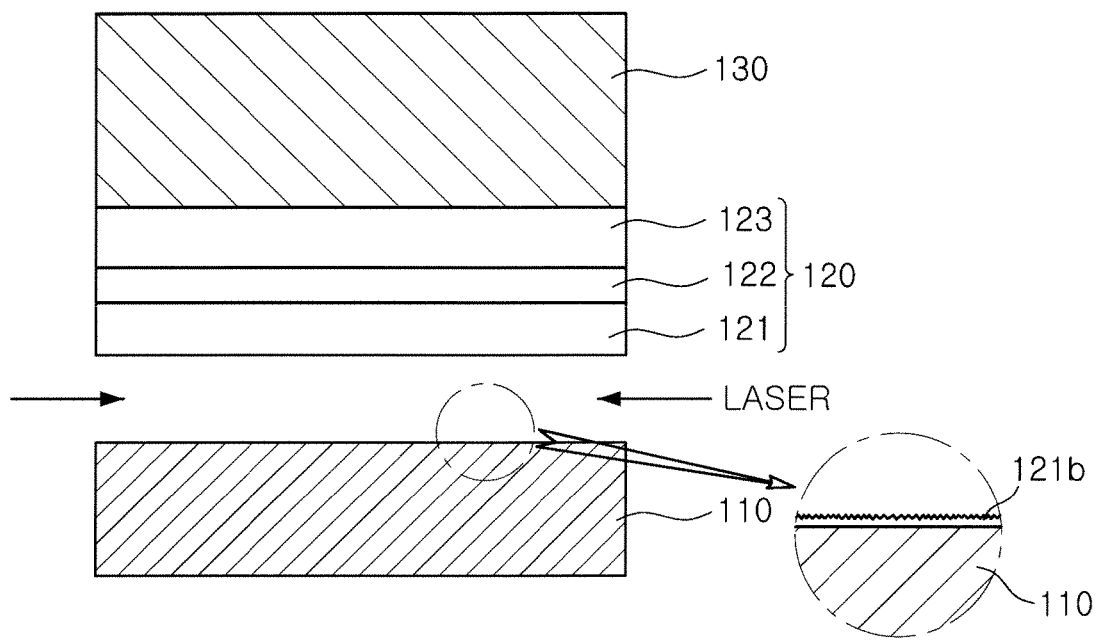
Figure 4:
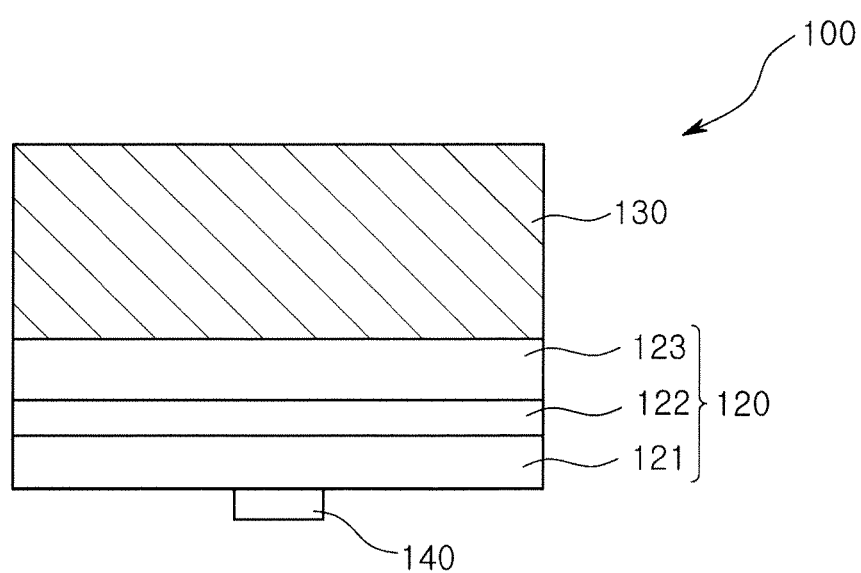
FIG. 4 is a cross-sectional view schematically showing a semiconductor light emitting device manufactured according to an example of the present application.

FIGS. 1 through 3 are cross-sectional views illustrating a sequential process of a method for manufacturing a semiconductor light emitting device according to an example of the present application. FIG. 4 is a cross-sectional view schematically showing a semiconductor light emitting device manufactured according to an example of the present application.

As a light emitting device 100, any photoelectronic device may be used, as long as it can emit light when an electrical signal is applied thereto. Typically, a semiconductor light emitting device in which a semiconductor layer is epitaxially grown on a growth substrate 110 may be used. Here, any one of a sapphire, silicon carbide (SiC), silicon (Si), $MgAl_2O_4$, MgO, $LiAlO_2$, $LiGaO_2$ and GaN substrate may be used as the growth substrate, but the present application is not limited thereto. In the present example, a sapphire substrate is used.

First, as illustrated in FIG. 1, a light emitting structure 120 is formed on a semiconductor growth substrate 110.

In detail, the light emitting structure 120 may be a nitride semiconductor layer including a first conductivity-type semiconductor layer 121, an active layer 122, and a second conductivity-type semiconductor layer 123. The first conductivity-type semiconductor layer 121 may include an n-type semiconductor layer, and the second conductivity-type semiconductor layer 123 may include a p-type semiconductor layer.

The n-type semiconductor layer and the p-type semiconductor layer may be made of a semiconductive material doped with an n-type impurity and a p-type impurity having an empirical formula $Al_xIn_yGa_{(1-x-y)}N$, and the semiconductive material may be, GaN, AlGaN, or InGaN. Here, the x and y values may be within the range of $0 \le x \le 1$, $0 \le y \le 1$, and $0 \le x+y \le 1$.

Silicon (Si), germanium (Ge), selenium (Se), tellurium (Te), carbon (C), or the like, may be used as the n-type impurity; and manganese (Mn), zinc (Zn), beryllium (Be), or the like, may be used as the p-type impurity.

In the present example, GaN layers may be used as the first and second conductivity-type semiconductor layers 121 and 123, and in this case, an n-GaN layer may be used as the first conductivity-type semiconductor layer 121 and a p-GaN layer may be used as the second conductivity-type semiconductor layer 123.

The light emitting structure 120 may be grown through metal-organic chemical vapor deposition (MOCVD), molecular beam epitaxy (MBE), hydride vapor phase epitaxy (HVPE), or the like.

Also, an undoped-GaN layer may be formed as a buffer layer (not shown) under the first conductivity-type semiconductor layer 121.

The active layer 122 may be a layer emitting visible light (having a wavelength within a range of about 350 nm to 680 nm), or may be configured as an undoped nitride semiconductor layer having a single or multi-quantum well (MQW) structure. The active layer 122 may have an MQW structure in which quantum well layers and quantum barrier layers are alternately laminated. For example, the active layer 122 can have a MQW structure in which quantum well layers and quantum barrier layers of $Al_xIn_yGa_{(1-x-y)}N$ ($0 \le x \le 1$, $0 \le y \le 1$, $0 \le x+y \le 1$) are alternately laminated to have a certain band gap, and electrons and holes are recombined by the quantum wells to emit light.

Next, as illustrated in FIG. 2, a support unit 130 is formed on the second conductivity-type semiconductor layer 123 to be coupled with the light emitting structure 120.

Also, a support unit 130 may support the light emitting structure 120 during a process such as a laser lift-off process, or the like, for removing the semiconductor growth substrate 110 from the light emitting structure 120, and may be made of a material including any one of gold (Au), nickel (Ni), aluminum (Al), copper (Cu), tungsten (W), silicon (Si), selenium (Se), and gallium arsenide (GaAs), e.g., a conductive material doped with aluminum (Al) on a silicon (Si) substrate.

Also, the support unit 130 may be bonded to the light emitting structure 120 by the medium of a conductive adhesive layer (not shown) using an eutectic metal such as AuSn, or the like.

Turning now to FIG. 3, the semiconductor growth substrate 110 is separated from the light emitting structure 120. The semiconductor growth substrate 110, in contact with the first conductivity-type semiconductor layer 121 of the light emitting structure, may be separated from the first conductivity-type semiconductor layer 121 through a laser lift-off process.

Here, a laser used for the laser lift-off process may be any one of a 193 nm excimer laser, a 248 nm excimer laser, a 308 nm excimer laser, an Nd:YAG laser, an He—Ne laser, an argon (Ar) ion laser, or the like.

Next, as illustrated in FIG. 4, an electrode 140 is formed on the first conductivity-type semiconductor layer 121, from which the semiconductor growth substrate 110 was removed, to manufacture a vertical semiconductor light emitting device. The manufactured semiconductor light emitting device 100 is used in a follow-up process, such as a packaging process, for manufacturing a light emitting device package.

The semiconductor growth substrate 110 separated from the semiconductor light emitting device 100 may be recycled to grow a semiconductor layer.

However, the semiconductor growth substrate 110 separated from the light emitting structure 120 may have a remnant or residual amount 121b of the first conductivity-type semiconductor layer which has not been removed during the laser lift-off process. The remaining first conductivity-type semiconductor layer 121b remaining on the semiconductor growth substrate may make it difficult to re-grow a semiconductor layer. Thus, in order to regrow the light emitting structure 120 on the semiconductor growth substrate 110, the first conductivity-type semiconductor layer 121b remaining on the semiconductor growth substrate 110 should be removed.

In the related art, in order to remove the first conductivity-type semiconductor layer 121b remaining on the semiconductor growth substrate 110, a method of mechanically fine-polishing the surface of the semiconductor growth substrate 110 is used. However, in the case of removing the residual amount of first conductivity-type semiconductor layer 121b with the mechanically polishing method exclusively, the semiconductor growth substrate 110 should be polished down to a certain depth to entirely remove the residual amount of first conductivity-type semiconductor layer 121b.

Thus, when the number of recycling times is increased (namely, when the semiconductor growth substrate 110 is increasingly recycled), the thickness of the semiconductor growth substrate 110 rapidly becomes thin, causing the semiconductor growth substrate 110 to have cracks or to be bent during the process of growing the semiconductor layer.

In an example of the present application, rather than polishing the first conductivity-type semiconductor layer 121b remaining on the semiconductor growth substrate 110 for the removal thereof, an interface between the remaining first conductivity-type semiconductor layer 121b and the semiconductor growth substrate 110 is etched to separate the remaining first conductivity-type semiconductor layer 121b.

Thus, the problem in which the thickness of the semiconductor growth substrate 110 is rapidly reduced is lessened, and in addition, an effect of increasing the amount of semiconductor growth substrates 110 able to be recycled is obtained. Also, since a remnant is removed by using a chemical method, a large number of semiconductor growth substrates 110 can be processed at a time, in comparison to the mechanical fine-polishing method by which semiconductor growth substrates 110 are individually polished. Since a large number of semiconductor growth substrates 110 may be processed at once, an amount of time required for recycling the individual semiconductor growth substrates 110 can be shortened.

This process will be described in detail. First, an interface between the semiconductor growth substrate 110 and the first conductivity-type semiconductor layer 121b is wet-etched such that the first conductivity-type semiconductor layer 121b remaining on the separated semiconductor growth substrate 110 may be removed.

Figure 5:
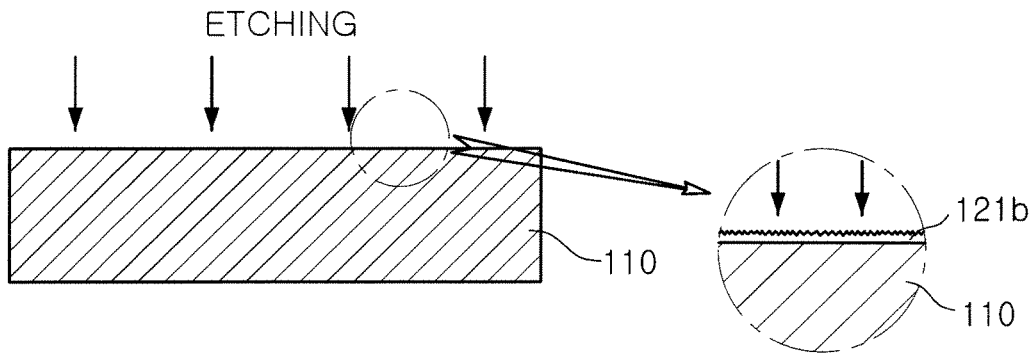
FIG. 5 is a view schematically showing a method of removing a light emitting structure remaining on a surface of a semiconductor growth substrate separated from the light emitting structure in FIG. 3.
Figure 6:
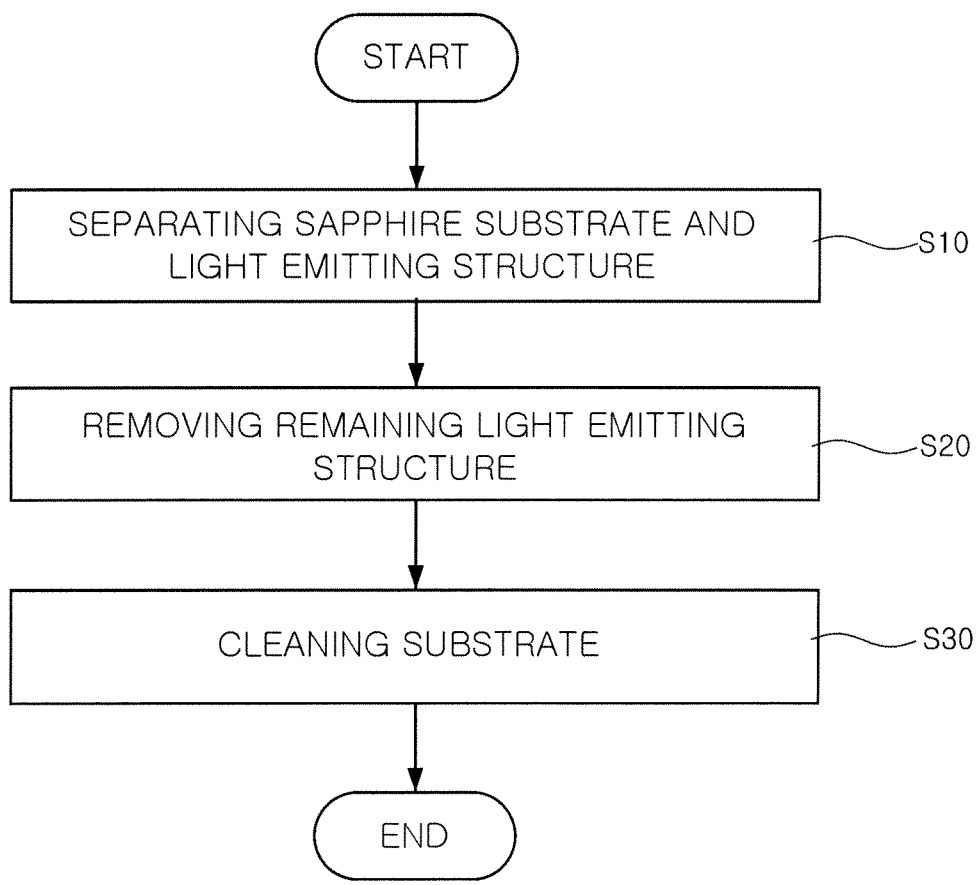
FIG. 6 is a flow chart illustrating a process of removing a light emitting structure remaining on the surface of the semiconductor growth substrate separated in FIG. 3.

FIG. 5 is a view schematically showing a method of removing the first conductivity-type semiconductor layer 121b remaining on the surface of the semiconductor growth substrate 110; and FIG. 6 is a flow chart illustrating a process of a method of removing the first conductivity-type semiconductor layer 121b remaining on the surface of the semiconductor growth substrate 110.

The method of removing the first conductivity-type semiconductor layer 121b remaining on the surface of the semiconductor growth substrate 110 includes an operation (S10) for separating the light emitting structure 120 from the semiconductor growth substrate 110; an operation (S20) for removing a remnant of the light emitting structure 120 such as the first conductivity-type semiconductor layer 121 from the semiconductor growth substrate 110; and an operation (S30) for cleaning the semiconductor growth substrate 110.

First, as described above, the light emitting structure 120 may be separated from the semiconductor growth substrate 110 (S10). Next, as illustrated in FIG. 5, an interface between the semiconductor growth substrate 110 and the first conductivity-type semiconductor layer 121b is wet-etched such that the remaining first conductivity-type semiconductor layer 121b is separated from the surface of the semiconductor growth substrate 110 (S20).

For the wet etching, an etching solution may be selected from the group consisting of KOH, NaOH, $NH_4OH$, and $H_2SO_3$:HCl, and a temperature for the etching may ranging from about 20° C. to 300° C. If the temperature for the wet etching is lower than about 20° C., etching may not be substantially performed; and if the temperature for the wet etching exceeds about 300° C., etching is excessively performed, so it becomes difficult controlling the etching operation. In detail, in an embodiment of the present invention, a KOH etching solution having a concentration of 2 mol/l may be used and a wet etching process may be performed at a temperature of 80° C.

When the wet etching process is performed, the first conductivity-type semiconductor layer 121b remaining on the surface of the semiconductor growth substrate 110 may be separated to be removed.

Figure 7A:
FIG. 7A is a sectional photograph obtained by imaging a light emitting structure remaining on the surface of the separated semiconductor growth substrate.
Figure 7B:
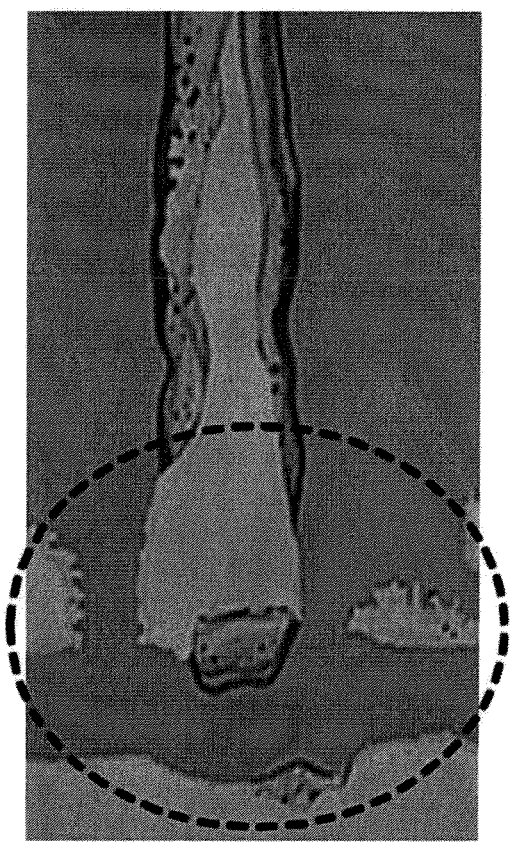
FIG. 7B is a sectional photograph obtained by imaging the light emitting structure separated from the surface of the separated semiconductor growth substrate.

FIG. 7A is a sectional photograph obtained by imaging the first conductivity-type semiconductor layer 121b remaining on the surface of the semiconductor growth substrate 110; and FIG. 7B is a sectional photograph obtained by imaging the first conductivity-type semiconductor layer 121b separated from the surface of the semiconductor growth substrate 110 through the wet etching process.

When the photograph of FIG. 7A is compared with the circled portion of the photograph of FIG. 7B, it can be seen that the first conductivity-type semiconductor layer 121b remaining in the photograph of FIG. 7A is separated.

In this manner, when the first conductivity-type semiconductor layer 121b remaining on the semiconductor growth substrate 110 is removed through wet etching, damage to the surface of the semiconductor growth substrate 110 is reduced to be about 0 μm to 5 μm. Namely, in comparison to the case of performing etching through a general mechanical polishing method, damage to the semiconductor growth substrate 110 is reduced and the amount of semiconductor growth substrates 110 able to be recycled can be increased.

An operation of fine-polishing the semiconductor growth substrate 110 may be additionally performed, after the remaining first conductivity-type semiconductor layer 121b is removed by wet-etching the semiconductor growth substrate 110.

For the fine-polishing of the semiconductor growth substrate 110, chemical mechanical polishing (CMP) may be used. Here, CMP refers to a method of smoothing a surface of a subject to be processed, through a mechanical/chemical complex action. For example, an abrasive cloth may be attached to a polishing stage, and the polishing stage and a subject to be treated may be separately rotated or shaken, while a slurry (i.e., an abrasive material) is supplied between the subject to be treated and the abrasive cloth. Accordingly, a surface of the subject to be treated is polished according to a chemical reaction between the slurry and the surface of the subject to be treated and a mechanical polishing action made on the subject to be treated by the abrasive cloth.

As for the number of performing polishing operations using CMP, the polishing operation may be performed only once, or a plurality of times. In the case of performing polishing a plurality of times, preferably, polishing having a high polishing rate is primarily performed, and thereafter, finishing polishing having a low polishing rate is performed. For the primary polishing, a polyurethane abrasive cloth is preferably used, and a particle diameter of slurry ranges from 120 nm to 180 nm and, for example, preferably, about 150 nm. For finishing polishing, a suede abrasive cloth is preferably used and a particle diameter of slurry ranges from 45 nm to 75 nm and, for example, preferably, about 60 nm.

Also, after the first conductivity-type semiconductor layer 121b remaining on the semiconductor growth substrate 110 is removed through wet-etching, CMP is performed, so a lapping process of mechanically polishing the semiconductor growth substrate 110 may not be performed. The lapping process is performed to polish the surface of the semiconductor growth substrate 110 through a mechanical method such as grinding, and here, since the surface of the semiconductor growth substrate 110 is uniformly removed to be smoothed, the surface of the semiconductor growth substrate 110 is greatly damaged. In an example of the present application, such a mechanical polishing process is not performed, so damage to the semiconductor growth substrate 110 is minimized even in the case that it undergoes the fine-polishing process.

After the wet etching process and the fine polishing process are performed, the semiconductor growth substrate 110 is cleaned.

As the cleaning process, ultrasonic cleaning based on pure water, section II stream jet cleaning based on pure water and nitrogen, or the like, may be performed. As the ultrasonic cleaning, megahertz ultrasonic cleaning (megasonic cleaning) may be used. After the foregoing ultrasonic cleaning or the section II stream jet cleaning operation is performed, the semiconductor growth substrate 110 may be cleaned with ozonic water.

Also, the cleaning process may include a chemical cleaning step using a chemical solution or a physical cleaning step using a brush. Here, the chemical cleaning step may be performed by using a first chemical solution containing an ammonium hydroxide ($NH_4OH$) solution having excellent capability of removing organic contaminants or a second chemical solution containing an hydrochloric acid (HCl) solution having an excellent capability of removing inorganic contaminants.

When the cleaning process is completed, the first conductivity-type semiconductor layer 121b is removed from the surface of the semiconductor growth substrate 110, so the semiconductor growth substrate 110 may be recycled to allow the light emitting structure 120 to be grown thereon.

As set forth above, the method of manufacturing a semiconductor light emitting device according to embodiments of the invention has an advantage of increasing the number of recycling a semiconductor growth substrate.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A method for manufacturing a semiconductor light emitting device, the method comprising steps of:
   forming a light emitting structure by sequentially growing a first conductivity-type semiconductor layer, an active layer, and a second conductivity-type semiconductor layer on a semiconductor growth substrate;
   disposing a support unit on the second conductivity-type semiconductor layer, so as to be combined with the light emitting structure;
   separating the semiconductor growth substrate from the light emitting structure;
   wet-etching an interface between the semiconductor growth substrate and a remaining light emitting structure such that the light emitting structure remaining on the separated semiconductor growth substrate is separated therefrom;
   chemically and mechanically fine-polishing the semiconductor growth substrate, after the interface between the remaining light emitting structure and the semiconductor growth substrate is wet-etched to separate the light emitting structure remaining on the separated semiconductor growth substrate, wherein a lapping process is not performed in the operation of chemically and mechanically fine-polishing the semiconductor growth substrate; and
   cleaning the semiconductor growth substrate.

2. The method of claim 1, wherein the light emitting structure is a nitride semiconductor layer.

3. The method of claim 2, wherein the nitride semiconductor layer is expressed by $Al_xIn_yGa_{(1-x-y)}N$, where $0 \le x \le 1$, $0 \le y \le 1$, and $0 \le x+y \le 1$.

4. The method of claim 1, wherein the wet-etching step is performed with an etching solution selected from the group consisting of KOH, NaOH, $NH_4OH$, and $H_2SO_3$:HCl.

5. The method of claim 4, wherein a temperature for the wet-etching process ranges from 20° C. to 300° C.

6. The method of claim 1, wherein the step of separating the semiconductor growth substrate from the light emitting structure is performed with a laser lift-off process.

7. The method of claim 1, wherein the semiconductor growth substrate is a substrate comprising sapphire, SiC, Si, $MgAl_2O_4$, MgO, $LiAlO_2$, $LiGaO_2$, or GaN.

8. The method of claim 1, further comprising the step of forming an electrode on a surface of the first conductivity-type semiconductor layer.

9. The method of claim 1, wherein the step of cleaning the semiconductor growth substrate includes a chemical cleaning operation and a physical cleaning operation.

10. The method of claim 1, wherein the growing of the first conductivity-type semiconductor layer includes growing a n-GaN layer.

11. The method of claim 1, wherein the growing of the second conductivity-type semiconductor layer includes growing a p-GaN layer.

12. The method of claim 1, wherein the light emitting structure is grown by way of metal-organic chemical vapor deposition (MOCVD), molecular beam epitaxy (MBE), or hydride vapor phase epitaxy (HVPE).

13. A method for manufacturing a semiconductor light emitting device, the method comprising steps of:
   forming a light emitting structure by sequentially growing a first conductivity-type semiconductor layer, an active layer, and a second conductivity-type semiconductor layer on a semiconductor growth substrate;
   bonding a support unit on the second conductivity-type semiconductor layer, so as to be coupled with the light emitting structure;
   separating the semiconductor growth substrate from the light emitting structure;
   removing a residual amount of the light emitting structure present on a surface of the semiconductor growth substrate by way of chemical etching; and
   chemically and mechanically fine-polishing the semiconductor growth substrate, after the residual amount of the light emitting structure present on the surface of the semiconductor growth substrate is removed by chemical etching, wherein a lapping process is not performed in the operation of chemically and mechanically fine-polishing the semiconductor growth substrate.

14. The method of claim 13, wherein the light emitting structure is a nitride semiconductor layer.

15. The method of claim 14, wherein the nitride semiconductor layer is expressed by $Al_xIn_yGa_{(1-x-y)}N$, where $0 \le x \le 1$, $0 \le y \le 1$, and $0 \le x+y \le 1$.

16. The method of claim 13, wherein the chemical etching step is performed with an etching solution selected from the group consisting of KOH, NaOH, $NH_4OH$, and $H_2SO_3$:HCl.

17. The method of claim 16, wherein a temperature for the chemical etching step ranges from 20° C. to 300° C.

18. The method of claim 13, further comprising:
cleaning the semiconductor growth substrate such that the semiconductor growth substrate can be reused; and
wherein the step of separating the semiconductor growth substrate from the light emitting structure is performed with a laser lift-off process.

19. The method of claim 13, wherein the semiconductor growth substrate is a substrate comprising sapphire, SiC, Si, $MgAl_2O_4$, MgO, $LiAlO_2$, $LiGaO_2$, or GaN.

* * * * *